United States Patent
Ohiwa et al.

(10) Patent No.: US 6,369,423 B2
(45) Date of Patent: *Apr. 9, 2002

(54) SEMICONDUCTOR DEVICE WITH A THIN GATE STACK HAVING A PLURALITY OF INSULATING LAYERS

(75) Inventors: Tokuhisa Ohiwa, Kawasaki (JP); Jeffrey P. Gambino, Gaylordsville, CT (US); Katsuya Okumura; Jun-ichi Shiozawa, both of Yokohama (JP)

(73) Assignees: Kabushiki Kaisha Toshiba, Kawasaki (JP); International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/033,899

(22) Filed: Mar. 3, 1998

(51) Int. Cl.[7] .................. H01L 29/76; H01L 29/94; H01L 31/062; H01L 31/113; H01L 31/119
(52) U.S. Cl. .................. 257/327; 257/332; 257/338; 257/369; 257/635; 257/750
(58) Field of Search .................. 257/327, 338, 257/369, 635, 750, 332, 319, 774, 306, 324, 326; 438/180, 182, 672, 675, 624, 639, 253, 258

(56) References Cited

U.S. PATENT DOCUMENTS

| 4,900,257 | A | | 2/1990 | Maeda | 437/200 |
|---|---|---|---|---|---|
| 5,164,333 | A | | 11/1992 | Schwalke et al. | 437/200 |
| 5,168,072 | A | | 12/1992 | Moslehi | 437/41 |
| 5,232,850 | A | * | 8/1993 | Liao | 257/369 |
| 5,258,645 | A | * | 11/1993 | Sato | 257/369 |
| 5,304,829 | A | | 4/1994 | Mori et al. | 257/324 |
| 5,317,180 | A | * | 5/1994 | Hutter et al. | 257/327 |
| 5,378,910 | A | * | 1/1995 | Yoshikawa | 257/319 |
| 5,397,909 | A | | 3/1995 | Moslehi | 257/383 |
| 5,401,666 | A | | 3/1995 | Tsukamoto | 437/174 |
| 5,438,006 | A | | 8/1995 | Chang et al. | 437/40 |
| 5,506,440 | A | | 4/1996 | Wei et al. | 257/506 |
| 5,517,045 | A | * | 5/1996 | Ho et al. | 257/327 |
| 5,523,616 | A | | 6/1996 | Den | 257/637 |
| 5,567,638 | A | | 10/1996 | Lin et al. | 437/46 |
| 5,578,524 | A | * | 11/1996 | Fukase et al. | 438/624 |
| 5,585,304 | A | | 12/1996 | Hayashi et al. | 437/62 |
| 5,616,933 | A | | 4/1997 | Li | 257/57 |
| 5,631,484 | A | * | 5/1997 | Tsoi et al. | 257/327 |
| 5,828,130 | A | * | 10/1998 | Miller et al. | 257/754 |
| 5,877,081 | A | * | 3/1999 | Matsumoto et al. | 438/624 |
| 5,894,160 | A | * | 4/1999 | Chan et al. | 257/382 |
| 6,018,184 | A | * | 1/2000 | Becker | 257/382 |
| 6,057,604 | A | * | 5/2000 | Nguyen | 257/774 |

FOREIGN PATENT DOCUMENTS

| JP | 40 5110103 A | * | 4/1993 | 257/327 |
|---|---|---|---|---|
| JP | 40 5136406 A | * | 6/1993 | 257/327 |

* cited by examiner

Primary Examiner—Olik Chaudhuri
Assistant Examiner—Theresa T. Doan
(74) Attorney, Agent, or Firm—Banner & Witcoff, Ltd.

(57) ABSTRACT

The present invention intends to provide a semiconductor device capable of realizing a thin gate stack and the manufacturing method thereof. A gate cap layer and/or a protection insulating film (an etching stopper) has a plurality of insulating materials such as oxide and nitride stacked on each other. With this structure, an insulating layer having an etching rate lower than that of the interlayer insulating layer, for example, can be exposed during the etching of the interlayer insulating layer, and the gate stack can be formed thin and the aspect ratio of the contact hole formed in the device can be reduced. The present invention can realize a thin gate stack in such a manner, and thus is suitable for a SAC used in a DRAM.

28 Claims, 8 Drawing Sheets

SEMICONDUCTOR DEVICE WITH A THIN GATE STACK HAVING A PLURALITY OF INSULATING LAYERS

BACKGROUND OF THE INVENTION

This invention relates to a semiconductor device having a multilayer structure (hereinafter referred to as "a stack structure") and attaining high integration density, particularly, to a semiconductor device wherein the aspect ratio of a contact hole or the like, which electrically connects the stacked layers in the stack structure can be reduced, thereby can be highly integrated, and the manufacturing method thereof.

The integration density of the semiconductor device such as a DRAM (Dynamic Random Access Memory) which requires to be highly integrated is increased by reducing the design rule. To form such a device, the self-alignment technique is widely employed, with which fine devices can be formed, irrelevant to the precision in the mask-alignment in the photolithography process.

The self-alignment technique is classified into various types. SAC, the self-alignment contact is one of the self-alignment techniques, which is necessary to form a 256M DRAM. With use of the SAC, contact holes are formed on the surface of the semiconductor layer, as designed. The SAC is a technique for obtaining a desired etching selectivity by forming an etching stopper on a gate electrode before forming an interlayer insulating film, thereby improving the margin to compensate the alignment error in the photolithography process.

FIGS. 1A–1H show the steps of the manufacturing process of the 256M DRAM, in accordance with the present POR (Process Of Record).

As shown in FIG. 1A, a thin gate oxide film 2 is formed on a silicon substrate 1, at first. Then, as shown in FIG. 1B, material of a gate electrode, i.e., a polycrystalline silicon (hereinafter referred to as "poly-Si") layer 3 of 100 nm thick and a tungsten silicon (hereinafter referred to as "WSi") layer 4 of 55 nm thick are stacked on the gate oxide film 2, and a silicon nitride (SiN) layer 5 having a 160 nm thickness as an insulating gate cap layer is further stacked thereon by the CVD technique.

Thereafter, by the photolithography technique and the RIE (Reactive Ion Etching), for example, the SiN layer 5, the WSi layer 4, and the poly-Si layer 3 are etched selectively at a portion so as to expose the gate oxide film 2, as shown in FIG. 1C, thereby a gate electrode is obtained. Subsequently, a post oxide film (not shown) is formed on side walls of the WSi layer 4 and the poly-Si layer 3 by the thermal oxidation technique or the like. Next, impurity such as arsenic is implanted in the silicon substrate 1 by the ion implantation technique, for example, through the gate oxide film 2 in order to form a drain (or source) diffusion layer 6 on the surface of the silicon substrate 1.

Subsequently, a SiN layer 7 having a 40 nm thickness is deposited as an etching stopper on the SiN layer 5 or side walls of the SiN layer 5, the WSi layer 4 and the poly-Si layer 3, and the gate oxide film 2 by the CVD technique, as shown in FIG. 1D. Then, a $SiO_2$ layer 8 as an interlayer insulating film is deposited on the SiN layer 7, as shown in FIG. 1E.

In this time, as shown in FIG. 1F, a photoresist layer 9 having a contact hole region is formed above the gate electrode by selectively depositing photoresist at a position substantially corresponding to that of the gate electrode. By depositing the photoresist in this manner, the contact hole region can be surely located in the photoresist layer 9, even if the photoresist layer 9 is formed to shift a little from a desired position.

Thereafter, the $SiO_2$ layer 8 exposed at the bottom of the opening portion of the contact hole region in the photoresist layer 9 is removed by the RIE technique, as shown in FIG. 1G. In this time, the SiN layer 7 is also etched at the upper corners of the gate electrode, with the SiN layer 5 also etched by about 10 nm at the upper corners.

After etching the $SiO_2$ layer 8, the SiN film 7 exist at the bottom of the contact hole region is etched by the RIE technique, as shown in FIG. 1H. In this time, the SiN layer 5 is also etched by about 100 nm to leave the 50 nm thick SiN layer above the gate oxide film 2 at the ends of the gate electrode.

Then, the exposed portion of the gate oxide film 2 and the photoresist layer 9 are removed, and a drain (or source) electrode is formed to contact with the surface of the exposed portion of the silicon substrate 1. In this manner, a MOS transistor applicable to a DRAM is obtained. A capacitor suitable to the desired type of the DRAM is then formed, and the desired DRAM is obtained.

The thickness of 50 nm of the SiN layer 5 located at the corners of the gate electrode shown in FIG. 1H, is the minimum thickness for preventing the leakage current which may flow from the conductive electrode filling the contact hole to the gate electrode. The minimum thickness is 50 nm now although the minimum thickness may be reduced to almost 20 nm in the device in the next generation.

As described above, in order to leave the 50 nm thick SiN layer after etching the $SiO_2$ layer 8 and the SiN film 7, a 160 nm thick SiN layer 5 needs to be formed at first.

Such a thick SiN layer 5, however, will increase the aspect ratio of the contact hole region arranged between the gate electrodes having a multilayer structure (hereinafter referred to also as "gate stack"), which makes it difficult to fill the contact hole with the $SiO_2$ layer 8 and to etch the $SiO_2$ layer 8.

Accordingly, the gate stack needs to be formed thin in height in view of the reduction of the aspect ratio of the contact hole region and the integration density of such a device required to be so highly integrated as the 256M DRAM or the device in the next generation, which has a finer pattern than the 256M DRAM.

In order to obtain such a thin gate stack, however, the filled oxide (the $SiO_2$ layer 8) needs to be etched with remarkably high etching selectivity in comparing with that of the nitride at the upper corners of the gate stack.

BRIEF SUMMARY OF THE INVENTION

The object of the present invention is to provide a semiconductor device capable of increasing the etching selectivity and reducing the aspect ratio of the contact hole arranged between multilayered elements, thereby increasing the integration density, and the manufacturing method thereof.

The present invention is mainly characterized in that multilayered elements and the element to be etched are located on the same substrate, and the element to be etched is etched with high etching selectivity by exposing an etching stopper layer which is exist in the multilayered elements and has a low etching rate.

Further, according to the present invention, the thickness of the etching stopper can be reduced by forming the etching stopper to reduce the etching rate thereof, and thus the total thickness of the multilayered elements can be reduced, as a result. The self-alignment technique is not always essential to obtain the object of the present invention, but preferable to be employed in view of the improvement of the reliability. When the present invention is applied to a DRAM, the aspect ratio of the contact hole arranged between the gate stacks can be reduced, thereby the DRAM can obtain high integration density. Needless to say, it is understood that the present invention can be applied not only to the DRAM, but also the other device having such a multilayered structure.

In order to obtain the object of the present invention, the semiconductor device of the present invention is constituted as described below.

According to the first aspect of the present invention, the semiconductor device of the present invention comprises: a substrate; a gate insulating film selectively formed on the substrate; a gate electrode formed on the gate insulating film; a gate cap layer formed on the gate electrode; a protective insulating film (etching stopper) formed on the gate cap layer and side walls of the gate electrode; and a source and drain diffusion layer formed on the surface of the substrate to be contact with a channel forming region formed below the gate electrode.

According to the second aspect of the present invention, the manufacturing method of the semiconductor device of the present invention comprises the steps of: forming a gate electrode on a gate insulating film selectively formed on a substrate; forming a gate cap layer on the gate electrode; forming a diffusion layer at the substrate with use of the gate cap layer as a mask; forming a protective insulating film on the substrate so as to cover the gate cap layer and the gate electrode; forming an interlayer insulating film on the protective insulating film; forming an opening to be aligned with the gate electrode in a self-aligned manner by etching a part of the interlayer insulating film and a part of the protective insulating film in order to expose the surface of the substrate at the bottom of the opening; and forming a wiring layer electrically connected to the exposed surface of the substrate.

According to the first and second aspects of the present invention, the gate cap layer and/or the protective insulating film comprise a plurality of materials which are different from each other and stacked on each other.

More specifically, the protective insulating film may comprise a nitride layer formed on the gate cap layer and the side wall of the gate electrode, and a silicon layer formed on the nitride layer.

Similarly, the gate cap layer may comprise a nitride layer formed on the gate electrode, and an oxide layer formed on the nitride layer.

With the above-mentioned constitution, the present invention has the following effects and advantages;

According to the present invention, when the protective insulating film has the multilayered structure, the insulating layer having a lower etching rate than that of the interlayer insulating layer can be exposed during the etching of the interlayer insulating layer. The exposed insulating layer with the lower etching rate protects the gate stack from the etching, and the gate stack can be formed thin and the aspect ratio of the contact hole can be reduced. The reduction of the aspect ratio of the contact hole enables the integration density of the device increase.

When the gate cap layer has the multilayered structure, the insulating layer having a lower etching rate than that of the protective insulating layer can be exposed during the etching of the protective insulating layer at the bottom of the opening. The exposed insulating film protects the gate stack similarly to the above-mentioned case, and thus the gate stack can be formed thin, and the aspect ratio of the contact hole can be reduced. The reduction of the aspect ratio increases the integration density of the device, as described before.

When both of the protective insulating film and the gate cap layer have the multilayered structure, both have the above-mentioned advantages, and thus the gate stack can be formed thinner than those of the above-mentioned cases. The aspect ratio of the contact hole can be reduced more than the above-mentioned cases, and thus the integration density can be increased more.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF DRAWING

The accompanying drawings, which are incorporated in and constitute a part of the specification, illustrated presently preferred embodiments of the present invention and, together with the general description given above and the detailed description of the preferred embodiments given below, serve to explain the principles of the present invention.

DETAILED DESCRIPTION OF THE INVENTION

The embodiment of the present invention will be described below with reference to the drawings.

Figure 1A:
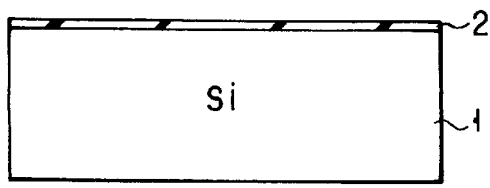
FIGS. 1A–1H are sectional views of a DRAM employing the conventional SAC technique, which show each step of the manufacturing process of a DRAM.
Figure 1B:
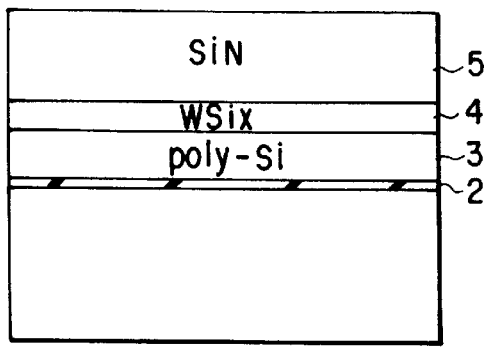
Figure 1C:
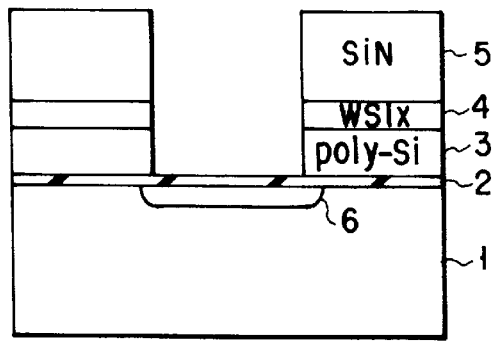
Figure 1D:
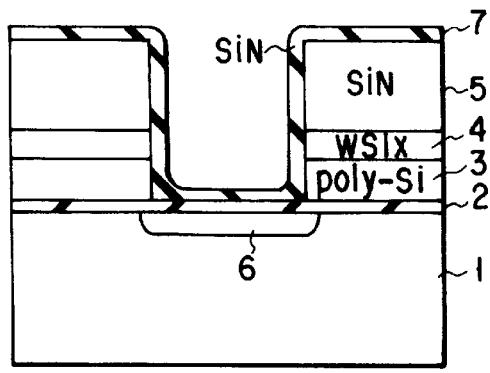
Figure 1E:
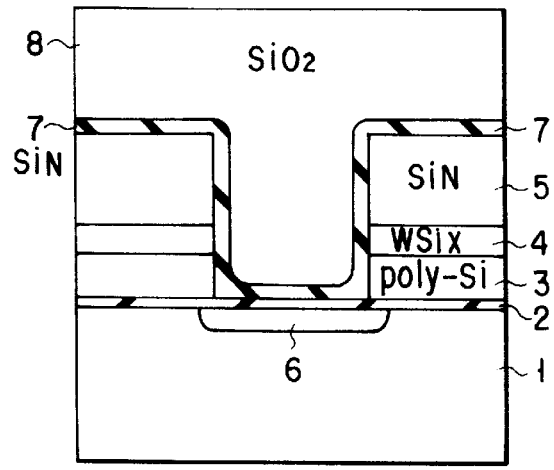
Figure 1F:
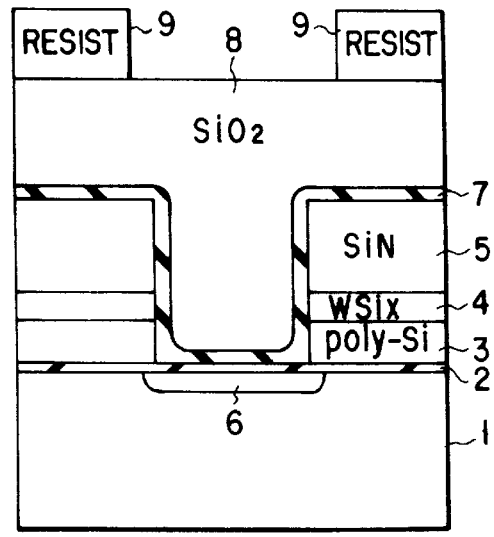
Figure 1G:
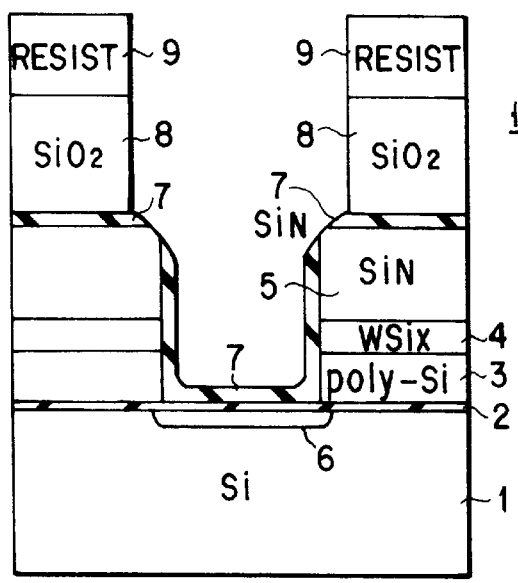
Figure 2:
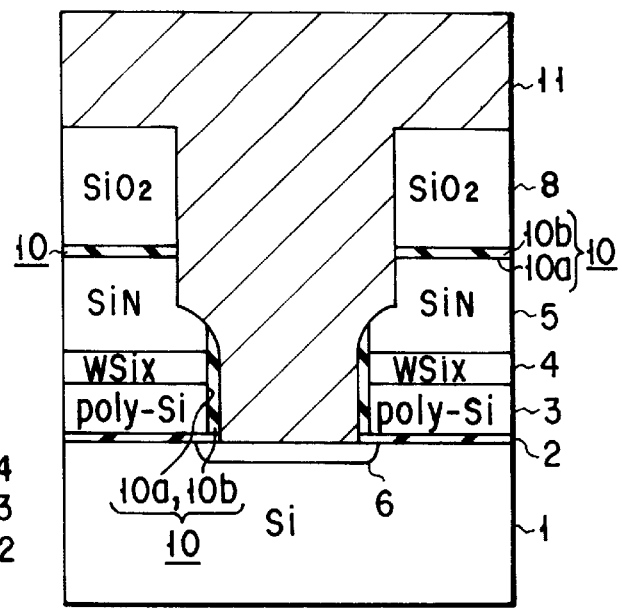
FIG. 2 is a sectional view showing a part of a semiconductor device according to the first embodiment of the present invention.
Figure 1H:
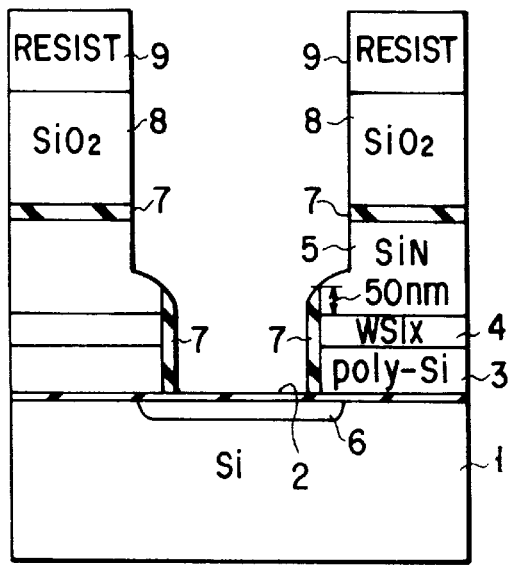

FIG. 2 is a sectional view showing a part of a semiconductor device according to the first embodiment of the present invention. The reference numerals designating the elements shown in FIGS. 1A–1H are also used in FIG. 2, and the detailed description of the elements will be omitted here. Only the elements not shown in FIGS. 1A–1H will be described below. The second and third embodiments will be described in the same manner.

The semiconductor device according to the first embodiment has a gate oxide film 2, a poly-Si layer 3, a WSi layer 4, a SiN layer 5, a multilayer stopper 10, and a SiO$_2$ layer 8, which are selectively formed on a silicon substrate 1. The multilayer stopper 10 is formed also on the side walls of the poly-Si layer 3, the WSi layer 4, and the SiN layer 5.

On the surface of the silicon substrate 1 between gate electrodes formed on the silicon substrate in such a manner, a drain (or source) diffusion layer 6 is formed. The drain (or source) diffusion layer 6 contacts with a wiring layer.

As is clear from the above, this semiconductor device has the multilayer stopper 10 which is not provided to the conventional device, on the SiN layer 5 as a gate cap film, and on the side walls of the poly-Si layer 3 and WSi layer 4 which function as the gate electrode.

The multilayer stopper 10 includes insulating materials which are different from each other and stacked each other. The lower one of the stacked insulating materials has a lower etching rate than that of the oxide which will be etched to form a contact hole.

More specifically, the multilayer stopper 10 has a stacked structure including a SiN layer 10a having a 20 nm thickness on the SiN layer 5 and on the side wall of the gate electrode, and, prior to annealing an amorphous silicon (αSi) layer 10b having a 10 nm thickness formed on the SiN layer 10a. The ratio of the etching rates of the amorphous silicon, SiN, and the oxide (the SiO$_2$ layer 8) during the etching of the SiO$_2$ layer 8 is represented as follows:

$$SiO_2:SiN:\alpha Si = 1:0.05:0.025 \quad (1)$$

The ratio of the etching rates during the etching of the SiN layer 10b as the nitride in the multilayer stopper 10 is represented as follows:

$$SiO_2:SiN:\alpha Si = 0.5:1:1 \quad (2)$$

The manufacturing process of the semiconductor device having the above-mentioned structure will be described next with reference to FIGS. 3A–3F.

Figure 3A:
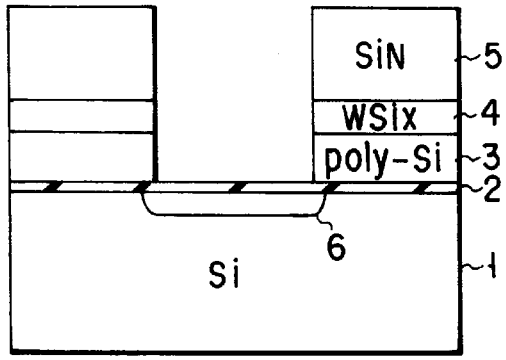
FIGS. 3A–3F are sectional views of the semiconductor device according to the first embodiment of the present invention, which show each step of the manufacturing process.

At first, the poly-Si layer 3, the WSi layer 4, and the SiN layer 5 are deposited in order, selectively on the gate oxide film 2 formed on the surface of the silicon substrate 1, as shown in FIG. 3A. Similarly, the drain or source diffusion layer 6 is formed selectively at the surface of the silicon substrate 1. These steps are performed in the same manner as that of the conventional method.

Figure 3B:
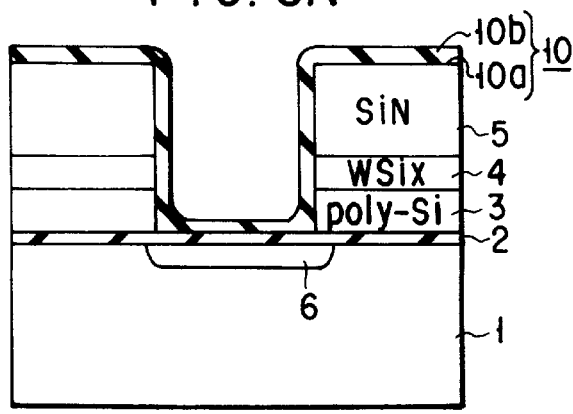

Subsequently, as shown in FIG. 3B, the multilayer stopper 10 including the SiN layer 10a of 20 nm thick and the amorphous silicon layer 10b of 10 nm thick is deposited on the SiN layer 5 or side walls of the SiN layers 5, the WSi layer 4 and the poly-Si layer 3, and the gate oxide film 2 by the CVD technique.

Figure 3C:
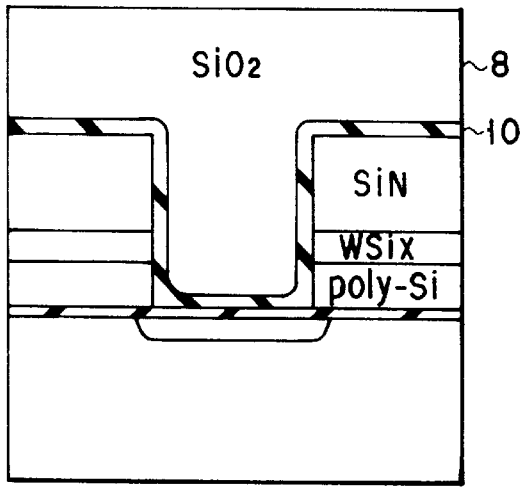
Figure 3E:
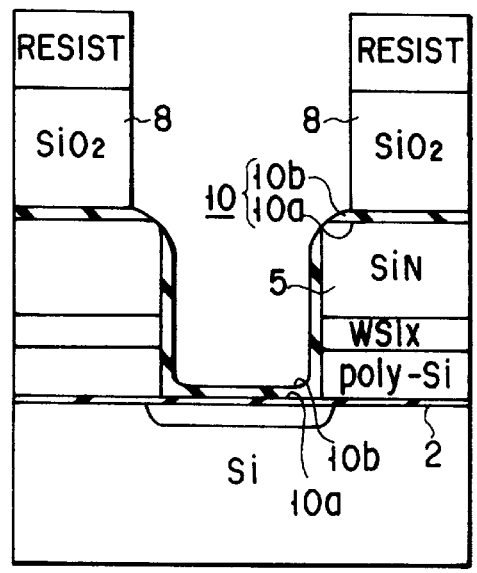
Figure 3D:
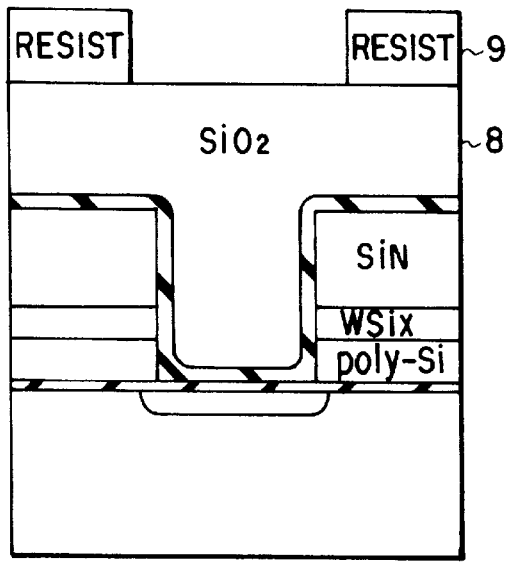

Thereafter, as shown in FIGS. 3C and 3D, the SiO$_2$ layer 8 and a photoresist layer 9 are also deposited on the multilayer stopper 10 in the same manner, in order.

Next, a part of the SiO$_2$ layer 8, the surface of which is exposed in the opening formed in the photoresist layer 9 is etched by the RIE technique, as shown in FIG. 3E. In this time, the amorphous layer 10b at the upper corners of the gate electrode and the SiN layer 10a stacked below the amorphous layer 10b are also etched, with the SiN layer 5 below these layers etched by about 10 nm.

The multilayer stopper 10 is formed to be thinner than that of the conventional SiN layer 7. However, the amorphous silicon layer 10b having the etching rate twice lower than that of the nitride is exposed at the upper corners of the gate electrode, and thus the etching depth of the SiN layer 5 at the corners of the gate cap can be maintained as in the conventional device without the excess etching, even though the multilayer stopper 10 has a small thickness.

Figure 3F:
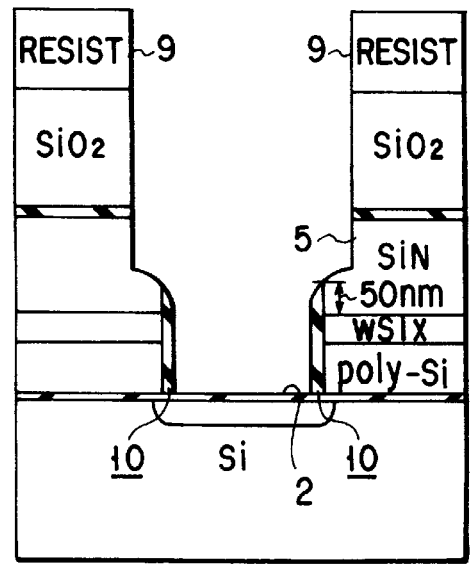

Next, as shown in FIG. 3F, the amorphous layer 10b and the SiN layer 10a of the multilayer stopper 10 are etched at the same etching rate in the RIE process at the bottom of a contact hole region. In this time, the SiN layer 5 at the corner of the gate electrode is etched by a 100 nm depth, and a 50 nm thick SiN layer 5 is remained.

The exposed gate oxide film 2 and the photoresist layer 9 are then removed. Subsequently, an amorphous silicon layer as a conductor is oxidized by the annealing technique to be turned into an insulator.

Thereafter, a wiring layer 11 as a drain (or source) electrode is formed as shown in FIG. 2 to be contact with the source/drain region at the exposed surface of the silicon substrate 1, thereby a MOS transistor applicable to a DRAM is obtained. The MOS transistor is, as shown in FIG. 4 or 5, incorporated into the DRAM in a suitable manner to the type of the DRAM.

Figure 4:
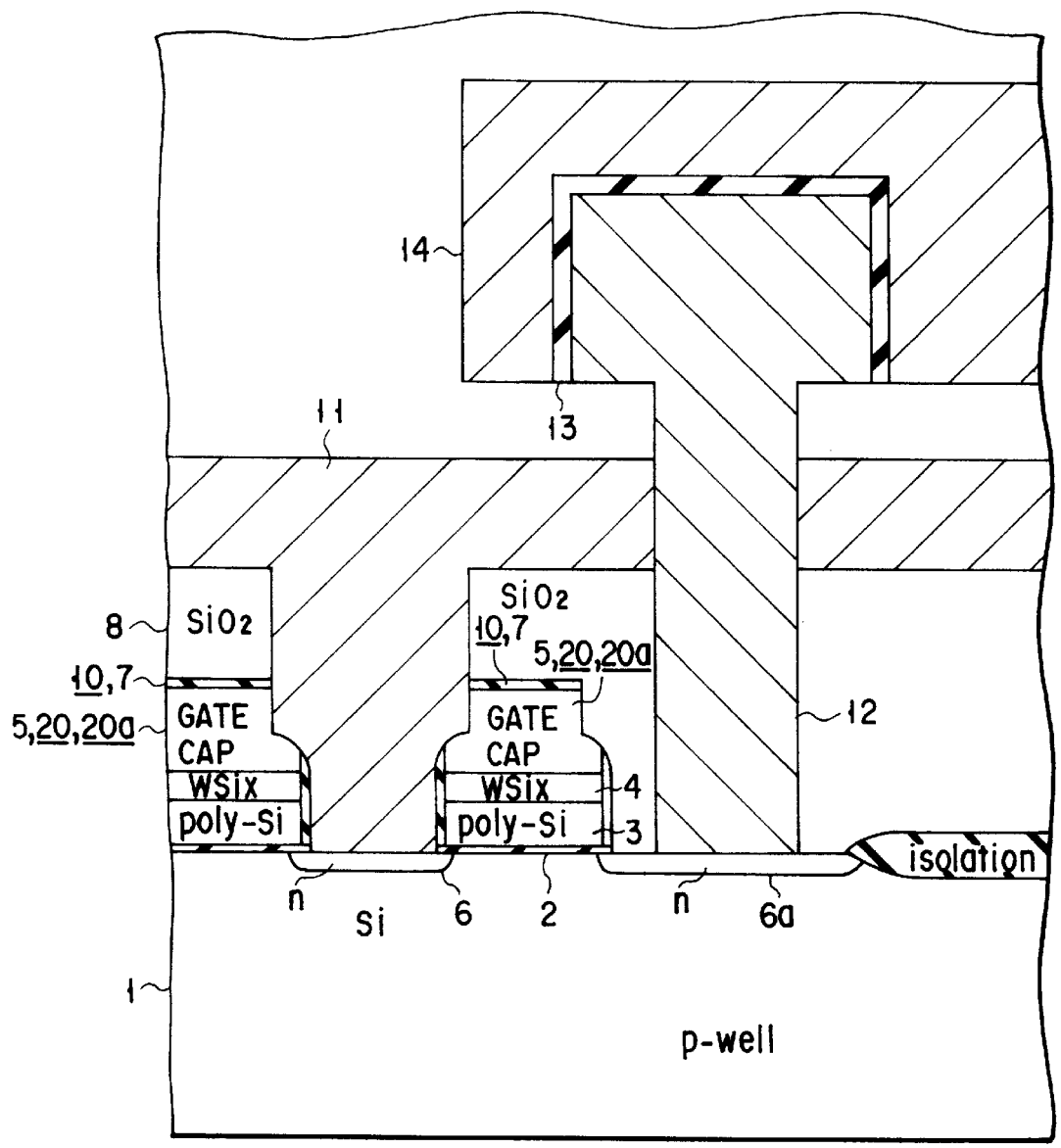
FIGS. 4 and 5 are sectional views of a DRAM incorporating a MOS transistor according to the first embodiment of the present invention.
Figure 5:
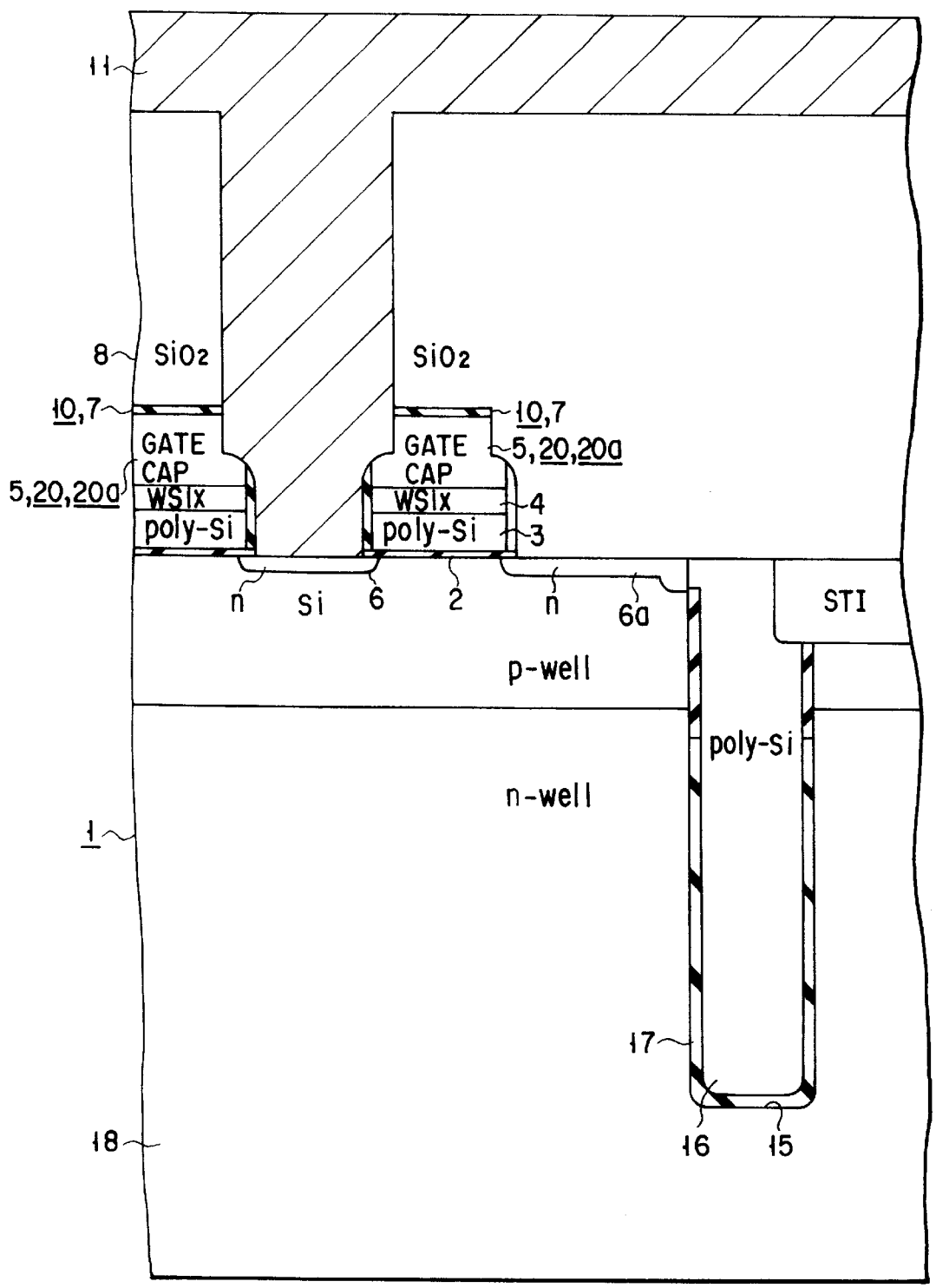

FIG. 4 is a sectional view of a stack-type DRAM incorporating the above-mentioned MOS transistor. In this DRAM, the MOS transistor is connected to a plate electrode 14 located in the upper portion of the DRAM through a N type diffusion layer 6a on the surface of the substrate 1, a wiring connection layer 12, and a capacitor 13. Similarly, FIG. 5 shows a sectional view of a DRAM having a substrate plate type trench, having the MOS transistor. In this DRAM, the MOS transistor is connected to an N-type well layer (plate electrode 18) through an N type diffusion layer 6a on the surface of the substrate 1, a buried electrode 16 in a trench 15, and a capacitor 17 on the sidewall of the trench.

As described before, according to the present invention, the amorphous silicon layer 10b having the etching rate lower than that of the SiO$_2$ layer 8 is exposed during the etching of the SiO$_2$ layer 8 as the interlayer insulating layer, and thus the gate stack can be formed thin in height since the amorphous silicon protects the gate stack, resulting in the reduction in the aspect ratio of the contact hole.

The gate stack according to the first embodiment of the present invention is thinner than the conventional one by 10 nm in height, and each of the etching stopper on the sidewalls of the gate stack is thinner than the conventional one by 10 nm. When the intervals of the gate electrodes is 200 nm, the aspect ratio of the contact hole according to the present invention is represented by the division of the height of the gate stack by the inner diameter of the contact hole, i.e., 345/140≈2.46, which is quite less than the conventional one as 355/120≈2.96. The reduction rate of the aspect ratio can be estimated also in the embodiments to be described below. The reduction in the aspect ratio realizes the high integration density of the device.

Figure 6:
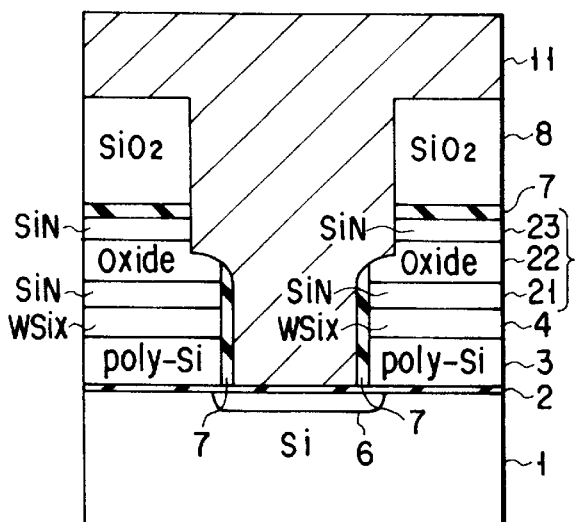
FIG. 6 is a sectional view showing a part of a semiconductor device according to the second embodiment of the present invention.

FIG. 6 is a sectional view showing a part of a semiconductor device according to the second embodiment of the present invention. The semiconductor device according to the second embodiment is provided with a multilayered gate cap 20 which includes a SiN layer 21 having a thickness of 50 nm, an oxide film 22 having a thickness of 50 nm, and a SiN layer 23 having a thickness of 10 nm on a WSi layer 4, instead of a SiN layer 5 having a thickness of 160 nm in the conventional device shown in FIG. 1H. The multilayered gate cap 20 having such a fabrication is thinner than the conventional gate cap SiN layer 5 by 50 nm.

In addition, the device of the second embodiment has a drain (or source) diffusion layer 6 formed in the surface of the silicon substrate 1 at a position between the gate electrodes, and a wiring layer 11 is formed to contact with the drain diffusion layer 6.

The multilayered gate cap 20 includes the stacked structure of the insulating materials different from each other, and has the insulating material ($SiO_2$) arranged in the midst of the stacked structure has an etching rate lower than that of the nitride which will be etched.

The manufacturing method of the above-mentioned semiconductor device will be described below.

Figure 7C:
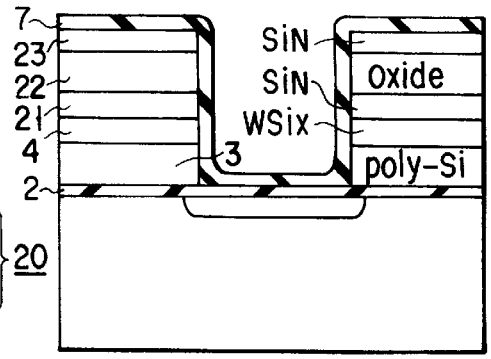
FIGS. 7A–7G are sectional views of the semiconductor device according to the second embodiment of the present invention, which show each step of the manufacturing process of a semiconductor device.
Figure 7A:
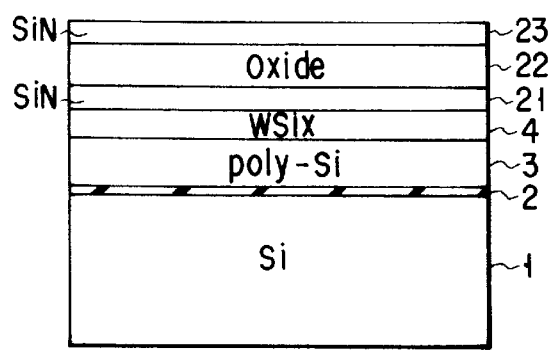

As shown in FIG. 7A, the poly-Si layer 3, the WSi layer 4, the SiN layer 21 having a thickness of 50 nm, the oxide film 22 having a thickness of 50 nm, and the SiN layer 23 having a thickness of 10 nm are deposited on the gate oxide film 2 on the surface of the silicon substrate 1, in order.

Figure 7D:
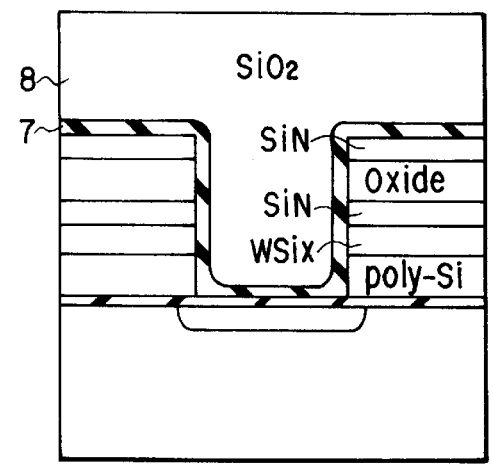
Figure 7B:
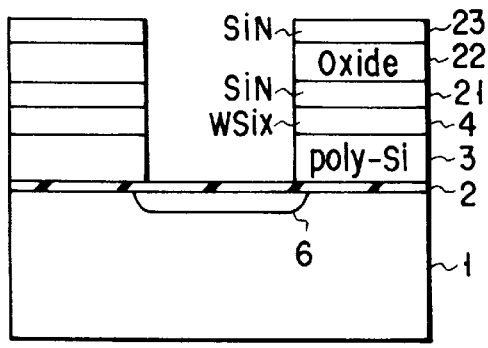

Subsequently, as shown in FIG. 7B, the selective etching is performed by the photolithography and the RIE methods from the SiN layer 23 to the poly-Si layer 3, so as to expose the gate oxide film 2, thereby obtain a gate electrode, similarly to the first embodiment. Then, a post oxide film (not shown) is formed on the side walls of the WSi layer 4 and the poly-Si layer 3. Thereafter, a drain (or source) diffusion layer 6 is formed in the surface of the substrate by the ion implantation method.

Figure 7E:
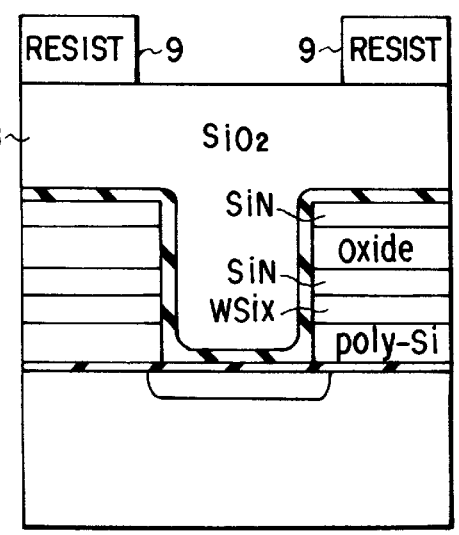

Next, a SiN layer 7 having a thickness of 40 nm is deposited on the SiN layer 23 or side walls of the SiN layer 23, the oxide film 22, the SiN layer 21, the WSi layer 4 and the poly-Si layer 3, and the gate oxide film 2 by the CVD method, as shown in FIG. 7C. As shown in FIGS. 7D and 7E, a $SiO_2$ layer 8 and a photoresist layer 9 are then formed on the SiN layer 7, in order.

Figure 7F:
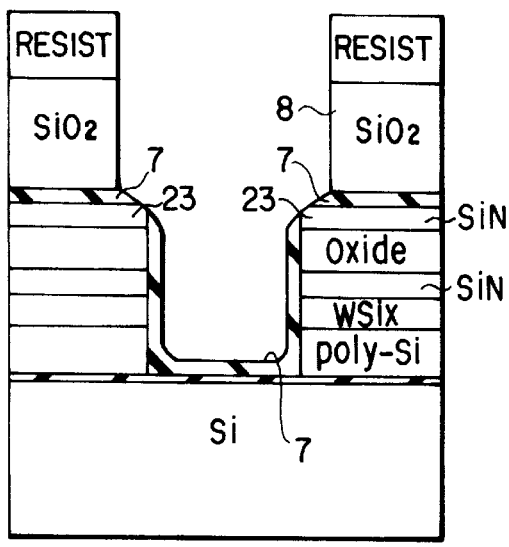

Subsequently, the $SiO_2$ layer 8 exposed at the bottom of the opening in the photoresist layer 9 is etched by the RIE method, as shown in FIG. 7F. In this time, the SiN layer 7 at the upper corners of the gate electrode is etched together with the SiN layer 23 etched by about 10 nm.

Figure 7G:
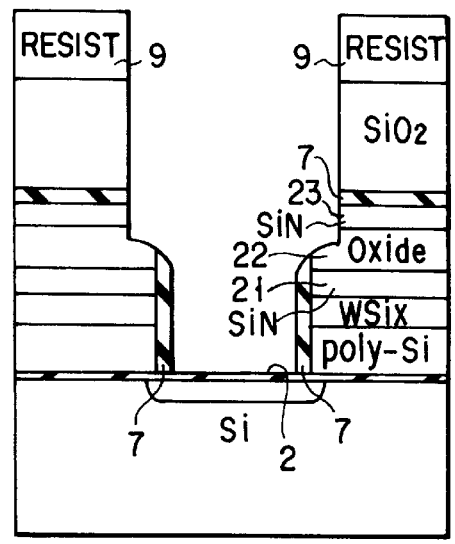

Next, as shown in FIG. 7G, the SiN layer 7 as a multilayer stopper is etched by the RIE method. During the etching of the SiN layer 7, the oxide film 22 having the etching rate twice lower than nitride is exposed at the upper corner of the gate electrode. With the exposed oxide film 22, the total thickness of the gate cap can be reduced by 50 nm in comparing with the conventional one. Further, in etching the SiN layer 7, the oxide film 22 at the upper corner of the gate electrode is etched by about 50 nm, and thus the SiN layer 21 of a 50 nm thickness is left not etched though the oxide film is totally etched.

The exposed gate oxide film 2 and the photoresist layer 9 are then removed. Subsequently, an amorphous silicon layer as a conductor is oxidized by annealing to be turned into an insulator.

Next, a drain (or source) electrode is formed to be contact with the exposed surface of the silicon substrate 1, thereby a MOS transistor applicable to a DRAM as shown in FIG. 6 is obtained. Similarly to the first embodiment, the MOS transistor is incorporated into the DRAM in a suitable manner to the type to the DRAM, as shown in FIG. 4 or 5.

According to the second embodiment, in the device with the gate cap layer having the multilayered structure, the oxide film 22 in the multilayered gate cap 20 which has the etching rate lower than that of the SiN layer 7 is exposed during the etching of the SiN layer 7 located at the bottom of the contact hole, as described before. It means that the gate stack can be formed thin, and the reduced aspect ratio and the high integration density can be attained.

Figure 8:
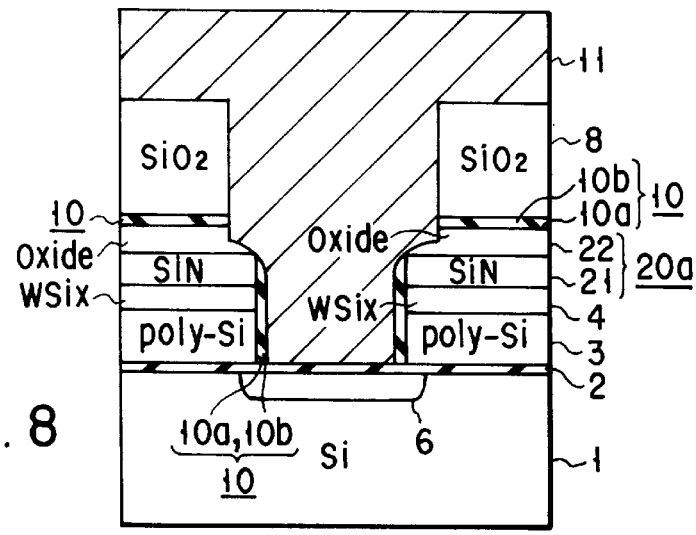
FIG. 8 is a sectional view showing a part of the semiconductor device according to the third embodiment of the present invention.

FIG. 8 is a sectional view showing a part of a semiconductor device according to the third embodiment of the present invention. The semiconductor device according to the third embodiment is the combination of the semiconductor devices according to the first and second embodiments. As shown in FIG. 8, a multilayered gate cap 20a which includes a SiN layer 21 having a thickness of 50 nm, and an oxide film 22 located above and having a thickness of 50 nm is formed on a WSi layer 4. The multilayered gate cap has a thickness of 100 nm and thus is 60 nm thinner than the conventional gate cap (SiN layer 5), and 10 nm thinner than the gate cap 5 of the first embodiment.

The oxide film 22 of the multilayered gate cap 20a is provided thereon with a multilayer stopper 10 including a SiN layer 10a of 20 nm thick and, prior to annealing an amorphous silicon layer 10b of 10 nm thick formed on the SiN layer 10a. On the amorphous silicon layer 10b of the multilayer stopper 10 is provided with a $SiO_2$ layer 8 thereon. The multilayer stopper 10 is provided also to the sidewalls of the poly-Si layer 3, the WSi layer 4, and the SiN layer 21.

The multilayered gate cap 20a is located immediately under the amorphous silicon layer 10a having an etching rate lower than that of the oxide layer 22 during the etching of the oxide layer 22, and thus does not have the 10 nm thick SiN layer 23 which is provided to the device of the second embodiment.

The manufacturing method of the above-mentioned semiconductor device will be described below, with reference to FIGS. 9A–9G.

Figure 9A:
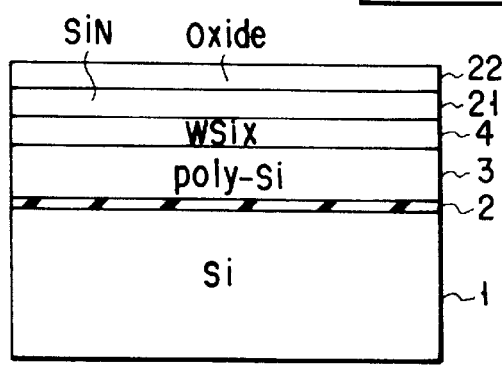
FIGS. 9A–9G are sectional views of the semiconductor device according to the third embodiment of the present invention, which show each step of the manufacturing process of the semiconductor device.

As shown in FIG. 9A, the poly-Si layer 3, the WSi layer 4, the SiN layer 21 having a thickness of 50 nm, and the oxide film 22 having a thickness of 50 nm are deposited on the gate oxide film 2 on the surface of the silicon substrate 1, in order.

Figure 9B:
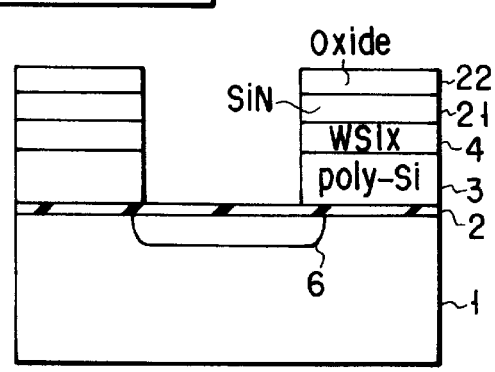

Subsequently, as shown in FIG. 9B, a gate electrode is obtained by performing the selective etching employing the photolithography and the RIE methods in the region from the oxide film 22 to the poly-Si layer 3 so as to expose the gate oxide film 2. A post oxide film (not shown) is formed on the side walls of the WSi layer 4 and the poly-Si layer 3. Thereafter, a drain (or source) diffusion layer 6 is formed in the surface of the substrate by the ion implantation method.

Figure 9C:
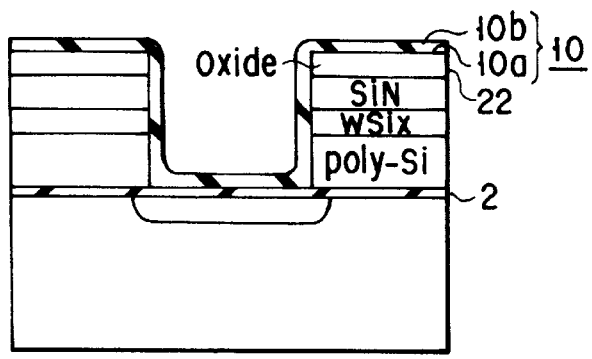

As shown in FIG. 9C, a multilayer stopper including a SiN layer 10a of 20 nm thick and an amorphous silicon layer 10b of 10 nm thick is deposited on the oxide film 22 and the gate oxide film 2 at the bottom of a contact hole.

Figure 9D:
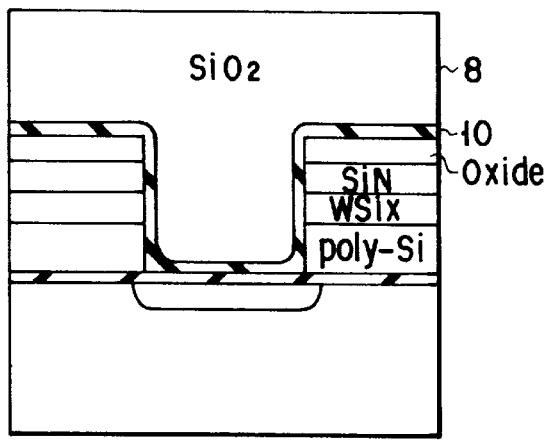
Figure 9E:
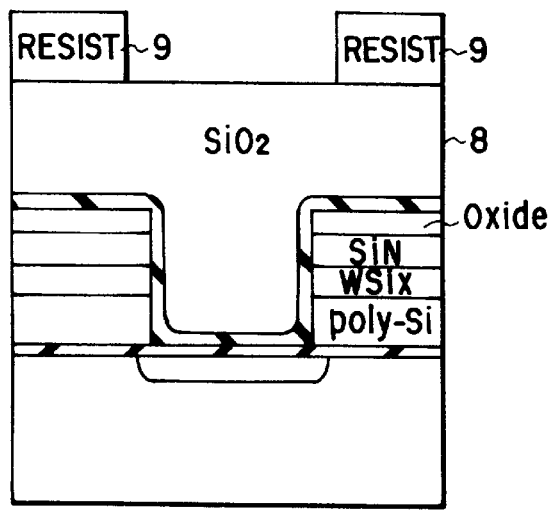

Then, similarly to the above-mentioned embodiments, a $SiO_2$ layer 8 and a photoresist layer 9 are formed on the multilayer stopper 10 in order, as shown in FIGS. 9D and 9E.

Figure 9F:
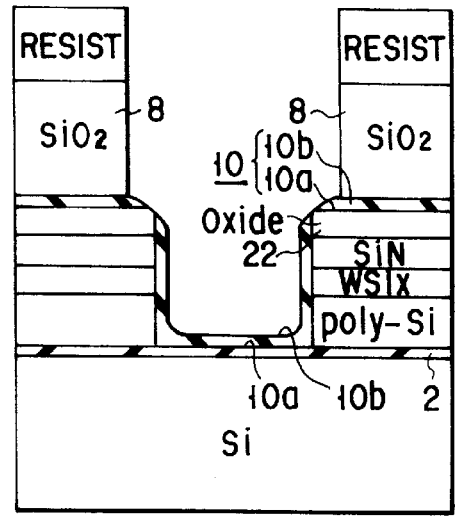

Subsequently, the $SiO_2$ layer 8 exposed in the opening in the photoresist layer 9 is etched by the RIE method, as shown in FIG. 9F. In this time, the amorphous silicon layer 10b at the upper corners of the gate electrode and the SiN layer 10a located therebelow are etched, with about 5 nm of the oxide film 22 etched.

Figure 9G:
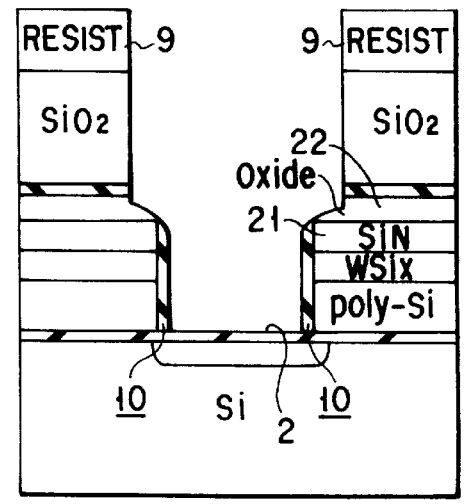

Next, as shown in FIG. 9G, the SiN layer 10a of the multilayer stopper 10 at the bottom of the contact hole region is etched by the RIE method. During the etching of the SiN layer 10a, the oxide film 22 having the etching rate twice lower than that of nitride is exposed at the upper corners of the gate electrode. By exposing this exposed oxide film 22 in such a manner, the gate cap can be formed to reduce the total thickness thereof by 60 nm in comparing with the conventional one. The oxide film 22 is etched at the upper corners of the gate electrode by about 50 nm during the etching of the SiN layer 10a, thereby the SiN layer 21 of 50 nm thick is left not etched.

Subsequently, the exposed gate oxide film 2 and the photoresist layer 9 are removed. An amorphous silicon layer 10b as a conductor is then oxidized by the annealing technique to be turned into an insulator.

Thereafter, a drain (or source) electrode is formed to be contact with the exposed surface of the silicon substrate 1, thereby a MOS transistor applicable to a DRAM as shown in FIG. 8 is obtained. Similarly to the above-mentioned embodiments, the MOS transistor is incorporated into the DRAM in a suitable manner to the type of the DRAM, as shown in FIG. 4 or 5.

As described above, the device according to the third embodiment has the structures of the devices of the first and second embodiments, and thus enjoys the effects which can be inferred from the devices of the first and second embodiments. More specifically, the gate stack of the third embodiment can be formed thinner than the first and second embodiments. Further, the aspect ratio of the contact hole region can be reduced more, and thus higher integration density can be attained in comparing with not only the conventional one, but also the first and second embodiments.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirits or scope of the general inventive concept as defined by the appended claims and their equivalents.

What is claimed is:

1. A semiconductor device with a thin gate stack including a plurality of insulating layers and a contact hole formed through the gate stack, comprising:
    a substrate;
    a gate oxide film formed selectively on the substrate;
    a gate electrode formed on the gate oxide film;
    a gate cap layer formed as an etching stopper on the gate electrode, and not extending over sidewalls of the gate electrode, the gate cap layer including a plurality of insulating layers;
    a protection insulating film formed on the gate cap layer and the sidewalls of the gate electrode; and
    a diffusion layer formed on a surface of the substrate so as to contact with a channel forming region formed below the gate electrode, the diffusion layer being located at a bottom of the contact hole
    wherein an etching rate of one of the insulating layers in the gate cap layer is lower than an etching rate of the protection insulating film.

2. A semiconductor device according to claim 1, wherein the gate cap layer has a nitride layer formed on the gate electrode and an oxide layer formed on the nitride layer.

3. A semiconductor device according to claim 1 wherein a surface of the gate cap layer adjacent the contact hole is narrower in width than the gate electrode.

4. A semiconductor device according to claim 1, further comprising: a wiring layer formed in contact with a surface of the diffusion layer, one of sidewalls of the protection insulating film and one of upper corners of the gate cap layer.

5. A semiconductor device with a thin gate stack including a plurality of insulating layers and a contact hole formed through the gate stack, comprising:
    a substrate;
    a gate oxide film formed selectively on the substrate;
    a gate electrode formed on the gate oxide film;
    a gate cap layer formed as an etching stopper on the gate electrode, and not extending over sidewalls of the gate electrode, the gate cap layer including a plurality of insulating layers;
    a protection insulating film formed as an etching stopper on a surface of the gate cap layer, a portion of sidewalls of the gate cap layer and said sidewalls of the gate electrode, the protection insulating film including a plurality of insulating layers; and
    a diffusion layer formed on a surface of the substrate so as to contact with a channel forming region formed below the gate electrode, the diffusion layer being located at a bottom of the contact hole
    wherein an etching rate of an upper layer in the insulating layers of the gate cap layer is lower than an etching rate of an under layer in the insulating layers of the protection insulating film.

6. A semiconductor device according to claim 5, wherein the protection insulating film has a nitride layer formed on the gate cap layer and an oxide layer formed on the nitride layer, the oxide layer being thinner than the nitride layer, and the gate cap layer has a nitride layer formed on the gate electrode and an oxide layer formed on the nitride layer.

7. A semiconductor device according to claim 5, wherein the protection insulating film is thinner than the gate cap layer.

8. A semiconductor device according to claim 7, wherein a surface of the gate cap layer adjacent the contact hole is narrower in width than the gate electrode.

9. A semiconductor device according to claim 8, further comprising: a wiring layer formed in contact with a surface of the diffusion layer, one of sidewalls of the protection insulating film and one of upper corners of the gate cap layer.

10. A semiconductor device according to claim 9, wherein the protection insulating film has a nitride layer formed on the gate cap layer and an oxide layer formed on the nitride layer, and the gate cap layer has a nitride layer formed on the gate electrode and an oxide layer formed on the nitride layer.

11. A semiconductor device according to claim 5, wherein a surface of the gate cap layer adjacent the contact hole is narrower in width than the gate electrode.

12. A semiconductor device according to claim 5, further comprising: a wiring layer formed in contact with a surface of the diffusion layer, one of sidewalls of the protection insulating film and one of upper corners of the gate cap layer.

13. A semiconductor device with a thin gate stack including a plurality of insulating layers and a contact hole formed through the gate stack, comprising:
    a substrate;
    a gate oxide film formed selectively on the substrate;
    a first gate electrode formed on the gate oxide film;
    a first gate cap layer formed as an etching stopper on the first gate electrode, and not extending over sidewalls of the first gate electrode, the first gate cap layer including a plurality of insulating layers;
    a first protection insulating film formed on a surface of the first gate cap layer, a portion of sidewalls of the first gate cap layer and sidewalls of the first gate electrode;
    a second gate electrode formed on a region of the gate oxide different from that of the first gate electrode;

a second gate cap layer formed as an etching stopper on the second gate electrode, and not extending over sidewalls of the second gate electrode, the second gate cap layer including a plurality of insulating layers;

a second protection insulating film formed on a surface of the second gate cap layer, a portion of sidewalls of the second gate cap layer and sidewalls of the second gate electrode;

a diffusion layer formed on a surface of the substrate so as to contact with a channel forming region formed below the first gate electrode and the second gate electrode, the diffusion layer being located at a bottom of the contact hole; and a wiring layer arranged in the contact hole in between the first gate electrode and the second gate electrode, the wiring layer being formed in contact with a surface of the diffusion layer, one of sidewalls of the first protection insulating film and one of sidewalls of the second protection insulating film wherein an etching rate of one of the insulating layers in the first gate gap layer is lower than an etching rate of the first protection insulating film, and an etching rate of one of the insulating layers in the second gate cap layer is lower than an etching rate of the second protection insulating film.

14. A semiconductor device according to claim 13, wherein the first and second gate cap layers have nitride layers formed on the first and second gate electrodes and oxide layers formed on the nitride layers.

15. A semiconductor device according to claim 14, wherein each of the first and second protection insulating films is thinner than each of the first and second gate cap layers.

16. A semiconductor device according to claim 15, wherein each of surfaces of the first and second gate cap layers adjacent the contact hole is narrower in width than each of the first and second gate electrodes.

17. A semiconductor device according to claim 13, wherein each of the first and second protection insulating films is thinner than each of the first and second gate cap layers.

18. A semiconductor device according to claim 13, wherein each of surfaces of the first and second gate cap layers adjacent the contact hole is narrower in width than each of the first and second gate electrodes.

19. A semiconductor device with a thin gate stack including a plurality of insulating layers and a contact hole formed through the gate stack, comprising:

a substrate;

a gate oxide film formed selectively on the substrate;

a first gate electrode formed on the gate oxide film;

a first gate cap layer formed as an etching stopper on the first gate electrode, wherein the first gate cap layer is not in contact with sidewalls of the first gate electrode, the first gate cap layer including a plurality of insulating layers;

a first protection insulating film formed as an etching stopper on a surface of the first gate cap layer, a portion of sidewalls of the first gate cap layer and sidewalls of the first gate electrode, the first protection insulating film including a plurality of insulating films;

a second gate electrode formed on a region of the gate oxide different from that of the first gate electrode;

a second gate cap layer formed as an etching stopper on the second gate electrode, wherein the second gate cap layer is not in contact with sidewalls of the second gate electrode, the second gate cap layer including a plurality of insulating layers;

a second protection insulating film formed as an etching stopper on a surface of the second gate cap layer, a portion of sidewalls of the second gate cap layer and sidewalls of the second gate electrode, the second protection insulating film including a plurality of insulating films;

a diffusion layer formed on a surface of the substrate so as to contact with a channel forming region formed below the first gate electrode and the second gate electrode, the diffusion layer being located at a bottom of the contact hole; and a wiring layer arranged in the contact hole in between the first gate electrode and the second gate electrode, the wiring layer being formed in contact with a surface of the diffusion layer, one of sidewalls of the first protection insulating film and one of sidewalls of the second protection insulating film;

wherein an etching rate of an upper layer in the insulating layers of the first gate gap layer is lower than an etching rate of an under layer in the insulating layers of the first protection insulating film, and an etching rate of an upper layer in the insulating layers of the second gate cap layer is lower than an etching rate of an under layer in the insulating layers of the second protection insulating film.

20. A semiconductor device according to claim 19, wherein the first and second protection insulating films have nitride layers formed on the first and second gate cap layers and oxide layers formed on the nitride layers, each of the oxide layers being thinner than each of the nitride layers, and the first and second gate cap layers have nitride layers formed on the first and second gate electrodes and oxide layers formed on the nitride layers.

21. A semiconductor device according to claim 20, wherein each of the first and second protection insulating films is thinner than each of the first and second gate cap layers.

22. A semiconductor device according to claim 21, wherein each of the surfaces of the first and second gate cap layers adjacent the contact hole is narrower in width than each of the first and second gate electrodes.

23. A semiconductor device according to claim 19, wherein each of the first and second protection insulating films is thinner than each of the first and second gate cap layers.

24. A semiconductor device according to claim 19, wherein each of the surfaces of the first and second gate cap layers adjacent the contact hole is narrower in width than each of the first and second gate electrodes.

25. A semiconductor device with a thin gate stack including a plurality of insulating layers and a contact hole formed through the gate stack, comprising:

a substrate;

a gate oxide film formed selectively on the substrate;

a gate electrode formed on the gate oxide film;

a gate cap layer formed as an etching stopper on the gate electrode, and not extending over sidewalls of the gate electrode, the gate cap layer including a plurality of insulating layers, the gate cap layer having a nitride layer formed on the gate electrode, an oxide layer formed on the nitride layer and another nitride layer formed on the oxide layer;

a protection insulating film formed on the gate cap layer and the sidewalls of the gate electrode, the protection insulating film being made of a nitride; and a diffusion layer formed on a surface of the substrate so as to contact with a channel forming region formed below the gate electrode, the diffusion layer being located at a bottom of the contact hole;

wherein an etching rate of the oxide layer in the gate cap layer is lower than that of the protection insulating film.

26. A semiconductor device with a thin gate stack including a plurality of insulating layers and a contact hole formed through the gate stack, comprising:

a substrate;

a gate oxide film formed selectively on the substrate;

a gate electrode formed on the gate oxide film;

a gate cap layer formed as an etching stopper on the gate electrode, and not extending over sidewalls of the gate electrode, the gate cap layer including a plurality of insulating layers, the gate cap layer having a nitride layer formed on the gate electrode and an oxide layer formed on the nitride layer;

a protection insulating film formed as an etching stopper on a surface of the gate cap layer, a portion of sidewalls of the gate cap layer and said sidewalls of the gate electrode, the protection insulating film including a plurality of insulating layers, the protection insulating film having a nitride layer formed on the gate cap layer and an oxide layer formed on the nitride layer; and a diffusion layer formed on a surface of the substrate so as to contact with a channel forming region formed below the gate electrode, the diffusion layer located at a bottom of the contact hole;

wherein an etching rate of the oxide layer in the gate cap layer is lower than that of the nitride layer in the protection insulating film.

27. A semiconductor device with a thin gate stack including a plurality of insulating layers and a contact hole formed through the gate stack, comprising:

a substrate;

a gate oxide film formed selectively on the substrate;

a first gate electrode formed on the gate oxide film;

a first gate cap layer formed as an etching stopper on the first gate electrode, and not extending over sidewalls of the first gate electrode, the first gate cap layer including a plurality of insulating layers, the first gate gap layer having a nitride layer formed on the gate electrode, an oxide layer formed on the nitride layer and another nitride layer formed on the oxide layer;

a first protection insulating film formed on a surface of the first gate cap layer, a portion of sidewalls of the first gate cap layer and said sidewalls of the first gate electrode, the first protection insulating film is made of a nitride;

a second gate electrode formed on a region of the gate oxide different from that of the first gate electrode;

a second gate cap layer as an etching stopper formed on the second gate electrode, and not extending over sidewalls of the second gate electrode, the second gate cap layer including a plurality of insulating layers, the second gate gap layer having a nitride layer formed on the gate electrode, an oxide layer formed on the nitride layer and another nitride layer formed on the oxide layer;

a second protection insulating film formed on a surface of the second gate cap layer, a portion of sidewalls of the second gate cap layer and sidewalls of the second gate electrode, the second protection insulating film is made of a nitride;

a diffusion layer formed on a surface of the substrate so as to contact with a channel forming region formed below the first gate electrode and the second gate electrode, the diffusion layer being located at a bottom of the contact hole; and a wiring layer arranged in the contact hole between the first gate electrode and the second gate electrode, the wiring layer being formed in contact with a surface of the diffusion layer, one of sidewalls of the first protection insulating film and one of sidewalls of the second protection insulating film, one of upper corners of the oxide layer in the first gate cap layer and one of upper corners of the oxide layer in the second gate cap layer;

wherein an etching rate of the oxide layer in the first gate cap layer is lower than that of the first protection insulating film, and an etching rate of the oxide layer in the second gate cap layer is lower than that of the second protection insulating film.

28. A semiconductor device with a thin gate stack including a plurality of insulating layers and a contact hole formed through the gate stack, comprising:

a substrate;

a gate oxide film formed selectively on the substrate;

a first gate electrode formed on the gate oxide film;

a first gate cap layer formed as an etching stopper on the first gate electrode, wherein the first gate cap layer is not in contact with sidewalls of the first gate electrode, the first gate cap layer including a plurality of insulating layers, the gate gap layer having a nitride layer formed on the gate electrode and an oxide layer formed on the nitride layer;

a first protection insulating film formed as an etching stopper on a surface of the first gate cap layer, a portion of sidewalls of the first gate cap layer and sidewalls of the first gate electrode, the first protection insulating film including a plurality of insulating films, the first protection insulating film having a nitride layer formed on the first gate cap layer and an oxide layer formed on the nitride layer;

a second gate electrode formed on a region of the gate oxide different from that of the first gate electrode;

a second gate cap layer formed as an etching stopper on the second gate electrode, wherein the second gate cap layer is not in contact with sidewalls of the second gate electrode, the second gate cap layer including a plurality of insulating layers, the gate cap layer having a nitride layer formed on the gate electrode and an oxide layer formed on the nitride layer;

a second protection insulating film formed as an etching stopper on a surface of the second gate cap layer, a portion of sidewalls of the second gate cap layer and sidewalls of the second gate electrode, the second protection insulating film including a plurality of insulating films, the second protection insulating film having a nitride layer formed on the second gate cap layer and an oxide layer formed on the nitride layer;

a diffusion layer formed on a surface of the substrate so as to contact with a channel forming region formed below the first gate electrode and the second gate electrode, the diffusion layer being located at a bottom of the contact hole; and a wiring layer arranged in the contact hole between the first gate electrode and the second gate electrode, the wiring layer being formed in contact with a surface of the diffusion layer, one of sidewalls of the first protection insulating film and one of sidewalls of the second protection insulating film, one of upper corners of the oxide layer in the first gate cap layer and one of upper coeners of the oxide layer in the second gate cap layer;

wherein an etching rate of the oxide layer in the first gate cap layer is lower than that of the nitride layer in the first protection insulating film, and an etching rate of the oxide layer in the second gate cap layer is lower than that of the nitride layer in the second protection insulating film.

* * * * *